United States Patent

[11] 3,569,867

[72] Inventor Robert L. Ernst
New Brunswick, N.J.
[21] Appl. No. 733,955
[22] Filed June 3, 1968
[45] Patented Mar. 9, 1971
[73] Assignee RCA Corporation

[54] TEMPERATURE-COMPENSATED FREQUENCY-VOLTAGE LINEARIZING CIRCUIT
4 Claims, 7 Drawing Figs.

[52] U.S. Cl. ........ 331/177, 307/230, 328/143
[51] Int. Cl. ........ H03b 3/04
[50] Field of Search ........ 307/230, 229; 328/142—146; 331/36 (C), 109, 177 (V); 330/30, 30 (D)

[56] References Cited

UNITED STATES PATENTS

| | | | |
|---|---|---|---|
| 2,692,333 | 10/1954 | Holmes | 328/143 |
| 3,117,293 | 1/1964 | Mortley | 334/15 |
| 3,119,012 | 1/1964 | Sherman | 328/143X |
| 3,444,477 | 5/1969 | Avins | 330/30X |
| 3,445,681 | 5/1969 | Cattermole et al. | 328/143X |
| 3,449,672 | 6/1969 | Thomas | 328/145X |
| 3,465,168 | 9/1969 | Luhowy et al. | 307/230 |

*Primary Examiner*—Roy Lake
*Assistant Examiner*—James B. Mullins
*Attorney*—Edward J. Norton

ABSTRACT: A technique is disclosed for providing a desired nonlinear output control voltage which has a continuous first derivative from a linear input command voltage. The output control voltage maintains its curvature and orientation in the presence of ambient temperature variations. This is accomplished by provision of a first circuit impedance which produces the desired nonlinear curvature as a function of a linear input, while a second impedance negates impedance changes in the circuit semiconductor devices due to the temperature changes.

Figure 1:
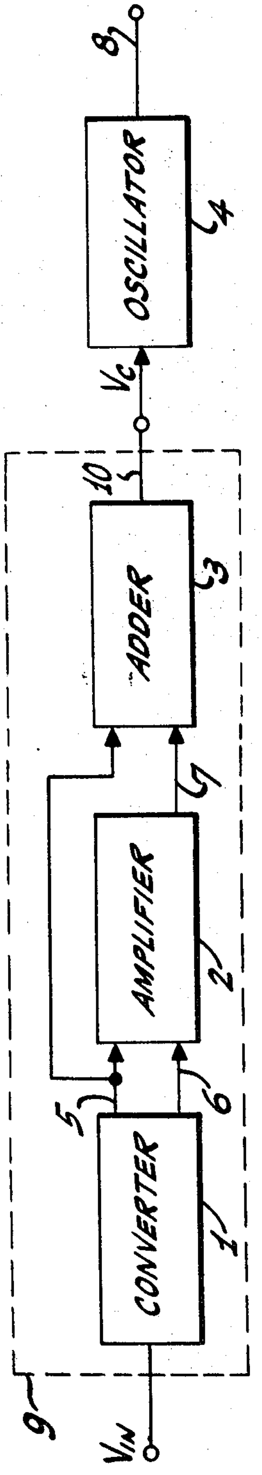

INVENTOR
ROBERT L. ERNST
BY Edward J. Norton
ATTORNEY

INVENTOR
ROBERT L. ERNST
BY Edward J. Norton
ATTORNEY

TEMPERATURE-COMPENSATED FREQUENCY-VOLTAGE LINEARIZING CIRCUIT

The invention herein described was made in the course of or under a contract or subcontract thereunder with the Department of the Navy.

BACKGROUND

One of the basic RF circuits available to a designer of electron tube circuits is the voltage-controlled oscillator. Such oscillators have an output frequency which is linearly proportional to a control voltage; use relatively simple circuits; and are insensitive to minor changes in temperature. For example, in FM broadcasting, a circuit known as a reactance tube modulator is available for small frequency changes. In commercial sweep oscillators where large frequency changes are required, a backward wave oscillator (BWO) tube is most frequently used. The simplicity of these tube circuits is lost when equivalent all solid-state circuits are used. For very small frequency changes, varactor diodes can be used as tuning elements. However, the resulting tuning curve is nonlinear, and attempts to use the oscillator for other than small frequency changes will result in distortion. For large frequency changes YIG (yttrium iron garnet) filters have been successfully used as tuning elements. However, such circuits are rather complex and have low output power. One potential method of obtaining a solid-state high-power oscillator capable of linear voltage controlled large frequency changes is to use a varactor diode-controlled oscillator proceded by a predistortion network. A characteristic of a varactor diode controlled voltage tuned oscillator is that its frequency is not a linear function of the varactor diode voltage. An approximately linear relation may be obtained by driving the varactor with a circuit which properly alters the input voltage. Many different circuits may be used for this function at a fixed ambient temperature, but until the development of the circuit of the present invention, none was adequately temperature compensated.

It is therefore an object of the present invention to provide an improved temperature-compensated voltage shaper circuit.

It is another object of the present invention to provide an improved means of linearizing the frequency versus control voltage characteristic of an oscillator over a desired ambient temperature range.

Briefly these and other objects are accomplished according to the present invention by proceeding the oscillator with a temperature self-compensating predistortion network which facilitates linearizing the oscillator frequency as a function of input control voltage over a desired ambient operating temperature range. The predistortion network has the novel feature, that over a range of ambient temperature, one portion thereof acts to provide a desired nonlinearity of the network transfer function, while a second portion contemporaneously acts to negate further nonlinearities introduced by impedance variation of circuit components with ambient temperature. The net result is that the voltage shaping performance of the predistortion network remains substantially the same over a range of ambient temperature.

FIG. 1 is a block diagram of an oscillator system embodying the present invention.

FIG. 2*a—c* are a series of waveforms indicating performance characteristics of the invention.

FIG. 3*a—b* are schematic circuit diagrams helpful in understanding the principles of the present invention.

Figures 3, 4:
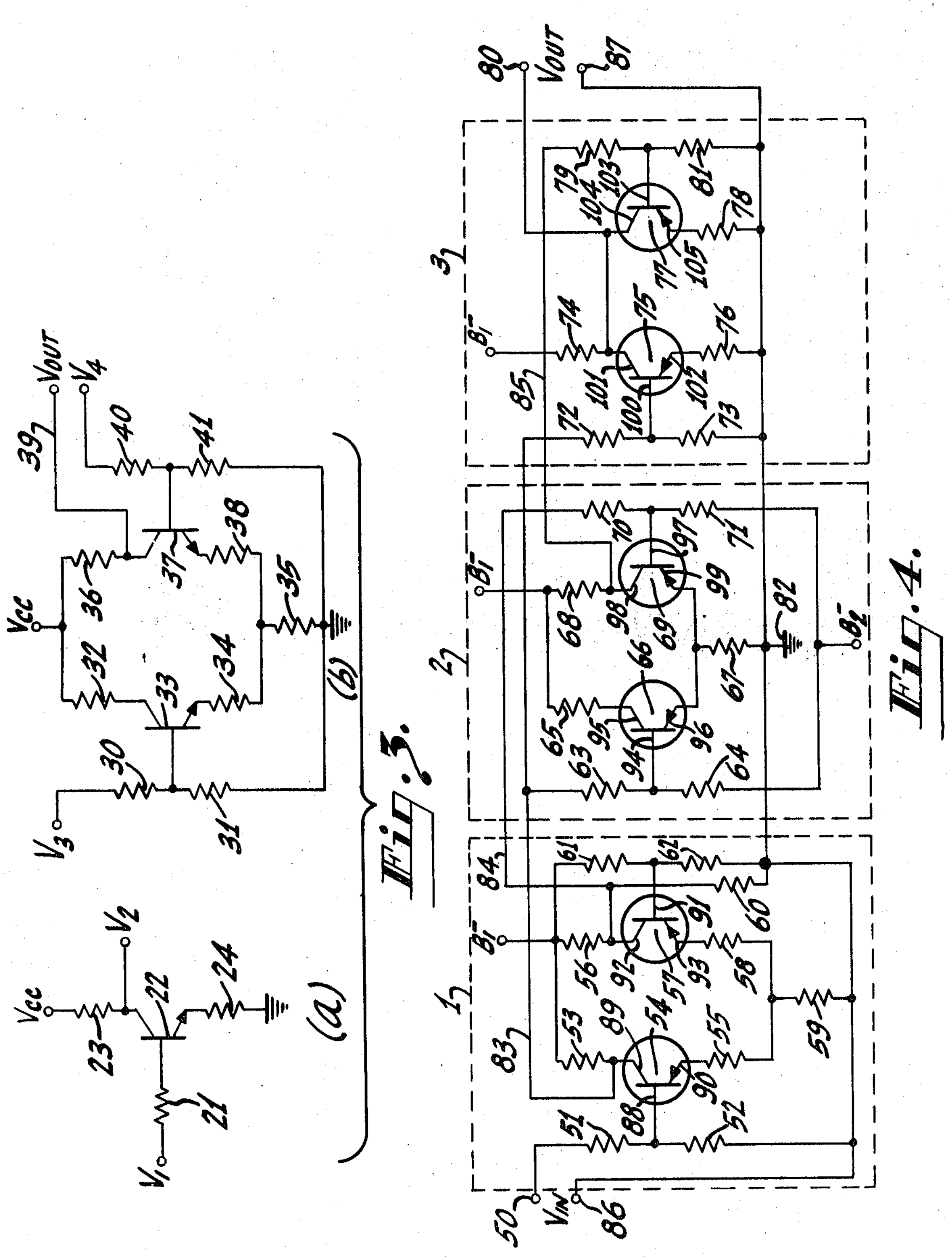

FIG. 4 is a schematic diagram of one embodiment of the invention.

FIG. 1 shows a block diagram of a voltage-controlled oscillator system embodying the present invention in the form of a shaper circuit 9 which includes a converter 1, amplifier 2 and an adder 3 which feeds a frequency controlling voltage to oscillator 4. The command voltage $V_{in}$ is fed to the input of the converter 1. The converter 1 produces complementary output signals on leads 5 and 6 which are fed to amplifier 2. The output signal of amplifier 2 on lead 7 is fed to one input of the adder 3. The second input to adder 3 is provided by the signal on lead 5 of the converter 1. The resulting output voltage of adder 3 on lead 10 forms the control voltage $V_c$ for oscillator 4 which produces the desired output frequency signal on lead 8.

Figure 2:
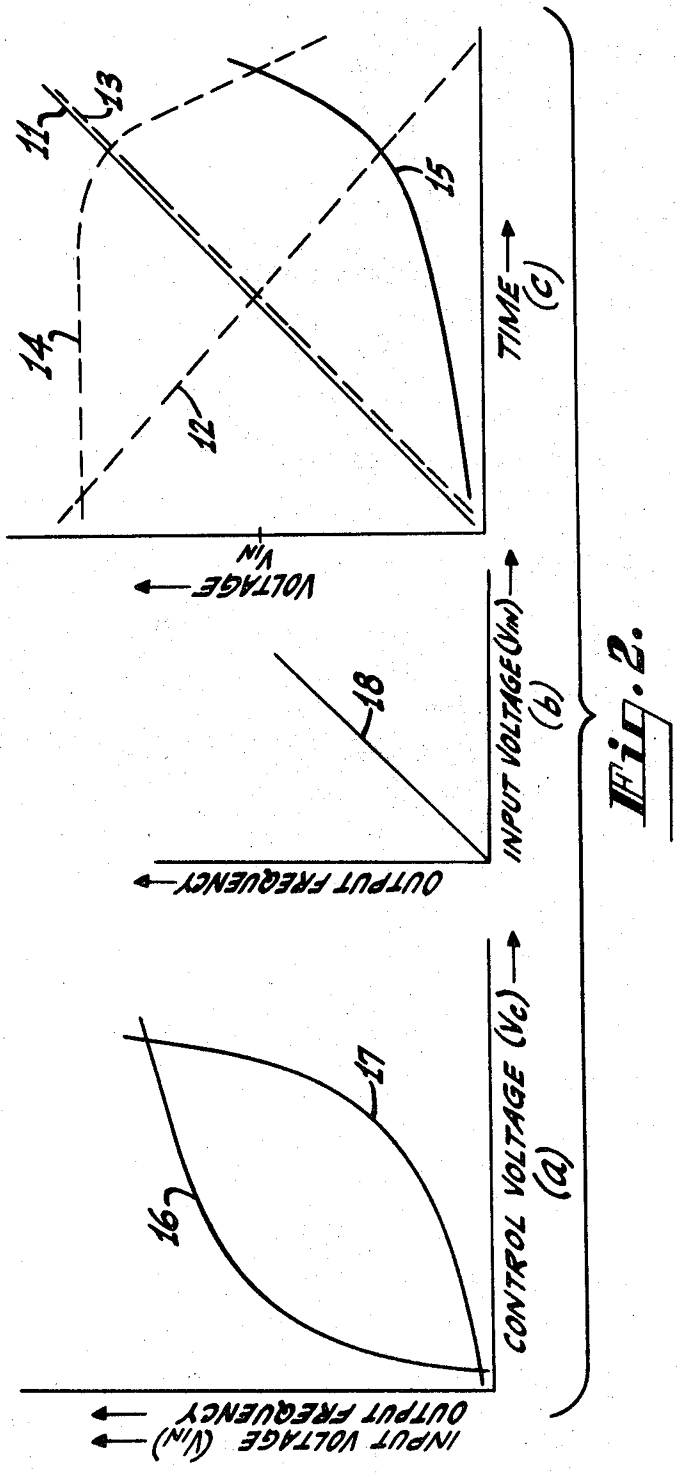

If reference is made to FIG. 2(*a*) there are shown two plots. The first plot 16 is output frequency as a function of control voltage for a voltage-controlled oscillator such as the oscillator 4 of FIG. 1. Curve 16 indicates a nonlinear variation of frequency of oscillator 4 for linear incremental changes of control voltage $V_c$. The second plot 17 is control voltage $V_c$ produced by the shaper circuit 9 as a function of the input command voltage $V_{in}$. The curvature and orientation of the voltage curve 17 produced by the shaper 9 when applied as the control voltage $V_c$ causes oscillator 4, as shown in FIG. 2(*b*), to produce an output frequency signal which varies linearly as a function of the input command voltage $V_{in}$.

The way in which the shaper circuit 9 produces the control voltage with the proper curvature an orientation can best be understood by reference to the waveforms of FIG. 2 (*c*) and their relation to the system of FIG. 1. The operation will be considered where the input control voltage $V_{in}$ is one which varies linearly with time as shown by curve 11 of FIG. 2 (*c*). In response to this voltage the converter 1 produces the complementary symmetrical linear voltages of curves 12 and 13 on leads 5 and 6 respectively. It is to be noted in the configuration being considered that the converter 1, amplifier 2 and adder 3 of shaper 9 are of the signal inverting type. The amplifier 2 is preferably a differential-type amplifier and the magnitude of the linear voltages on leads 5 and 6 are made such that the amplifier 2 will produce a nonlinear voltage on lead 7 with approximately the curvature shown as curve 14 of FIG. 2 (*c*). This is approximately the proper curvature shown as curve 14 of FIG. 2(*c*). This is approximately the proper curvature to compensate for the nonlinear frequency versus control voltage response of the oscillator, however the signal must be inverted and reoriented. This is accomplished by the adder 3 wherein the signal on lead 7 is inverted and shifted or tilted upward by the addition of the linear voltage present on lead 5 which is also fed into adder 3. The result is that the output on lead 10 which serves as the control voltage $V_c$ for oscillator 4 has the desired nonlinear curvature and orientation of curve 15 of FIG. 2(*c*).

The discussion thus far has not considered the effects of the operating or ambient temperature on the operating performance of a predistortion network such as the shaper circuit 9. Many circuits can be made to produce the desired shaped control voltage described above for a relatively constant ambient temperature. However, as the ambient temperature varies over an appreciable range, as is common in application of oscillator systems, the shape of the resulting control voltage changes. This produces an undesirable nonlinear output frequency signal as a function of input command voltage for the voltage-controlled oscillator. The shaper circuit 9 of the present invention oscillator. The shaper circuit 9 of the present invention is made substantially free of these undesirable variations of output control voltage with temperature by the means which are herein disclosed.

The way in which the shaper circuit 9 is able to maintain the desired output voltage characteristics, when subjected to ambient temperature changes, can best be understood by initially considering the circuits of FIG. 3(*a*)—(*b*). The circuit of FIG. 3(*a*) is a basic transistor stage. It is comprised of a transistor 22 having base, collector and emitter elements and suitable biasing is provided by resistors 21, 23 and 24 connected to the respective transistor elements. The input voltage $V_1$ is applied to the base of transistor 22 through resistor 21 and the output $V_2$ is derived from the junction of resistor 23 and the collector electrode. The resistor 21 is made sufficiently small that the base of the transistor 22 is then determined by the series combination of the emitter-base junction of the transistor 22 and the resistance of resistor 24. When resistor 24 is zero of a very small value, the base current increases in an approximately exponential manner as $V_1$ is increased. As the value of resistor 24 is increased, the base current approaches a condition in which it responds linearly to $V_1$. The collector current is essentially an inverted amplified version of the base current. Therefore, to obtain a smooth nonlinear transfer function in the transistor stage, a very small value of resistor 24 must be used. A simple technique to temperature stabilize such a transistor amplifier stage is to make resistor 24 large and resistor 21 small. However, this stability requirement is completely contradictory with the need for the large curvature of the predistortion shaper circuit. The circuit of the present invention permits both requirements to be satisfied. This will be best understood by considering the amplifier circuit of FIG. 3(*b*).

The circuit of FIG. 3 (*b*) is a type of differential amplifier. It comprises a first transistor 33 having base, collector and emitter electrodes with biasing resistors 31, 32 and 34, respectively. Transistor 33 is connected in parallel with a second transistor 37, having base collector and emitter electrodes with biasing resistors 41, 36 and 38 respectively. The emitter resistor 34 and 38 of the respective transistors are connected to ground through an additional common emitter resistor 35. A first circuit input $V_3$ is applied to the base of transistor 33 through resistor 30, and a second input $V_4$ is applied through resistor 40 to the base of the transistor 37. The output $V_{out}$ on lead 39 is taken from the junction of resistor 36 and the collector electrode of transistor 37. The input voltages $V_3$ and $V_4$ are balanced complementary inputs such as are shown by curves 12 and 13 of FIG. 2 (*c*). They may be expressed in the form of the algebraic sum of the common mode voltage $V_{cm}$ plus and minus a deviation $\Delta V$ from the common mode voltage. That is, if one input voltage say $V_3$ is value $\Delta V$ greater the $V_{cm}$ then the other input $V_4$ is made to be less than $V_{cm}$ by an amount $\Delta V$. With this form of inputs and the action of the differential amplifier circuit of FIG. 3 (*b*) the voltage across the common emitter resistor 35 and hence the current through it is determined by $V_{cm}$ and is independent of the deviation $\Delta V$. This is so, since the $+\Delta V$ will cause the current through one transistor to increase, and $-\Delta V$ will cause the current of the other transistor to decrease resulting in no net change of the current through the resistor 35. Hence, the voltage across resistor 35 is independent of the signal voltage $\Delta V$, and the equivalent emitter resistance of each signal circuit of transistors 33 and 37, is the value of their respective emitter resistors 34 and 38. However, for the operating DC bias circuitry of each of the respective transistors 33 and 37, the equivalent emitter resistance for each transistor is the sum of their emitter resistor plus two times the value of resistor 35 since resistor 35 passes the current of both transistors 33 and 37. That is, the operating DC emitter bias for transistor 33 is the value of resistor 34 plus twice the value of resistor 35; and for transistor 37 is the value of resistor 38 plus twice the value of resistor 35.

Recalling again the operation of the circuit of FIG. 3(*a*) which is applicable to both of the transistors 33 and 37 of FIG. 3(*b*); the desired curvature of output voltage $V_{out}$ for linear input voltages $V_3$ and $V_4$ may be obtained by making the value of the respective emitter resistors 34 and 38 small relative to the base-emitter junction resistance of the transistors. Now however if resistor 35 is also small and the ambient temperature of the circuit changes, the resultant change in base-emitter junction impedance of the transistors 33 and 37 will cause an undesirable shift of the operating point of the circuit and thus produce an erroneous output voltage $V_{out}$. This is so since the resistors 34, 35 and 38 are small, therefore the resistance of the base-emitter junction of the transistors has an appreciable effect on the operation of the circuit. This effect may be substantially eliminated by making the value of resistor 35 large relative to the base-emitter junction resistance of the transistors. The presence of large value resistor 35, minimizes the effect on the circuit operating point, due to the change of the smaller impedance of the base-emitter junctions as the ambient temperature varies. However, as explained above, since the value of emitter impedance from a signal voltage consideration is independent of the value of resistor 35, its large value will not alter the resultant desired curvature of $V_{out}$. Thus, according to the present invention a circuit is provided having the desired large curvature by providing very small emitter resistors 34 and 38 which is simultaneously temperature compensated by providing a large value for resistor 35.

The principles of the present invention are embodied in the circuit of FIG. 4 which is shown both schematically and functionally by dashed boxes comprising the converter 1, amplifier 2, and adder 3. Schematically the circuit of FIG. 4 is comprised of first and second input terminals 50 and 86, across which the input voltage $V_{in}$ is impressed on the converter 1. Terminal 50 is connected through resistor 51 to the base 88 of transistor 54. Terminal 86 is connected to the ground 82. A resistor 52 is connected between the base 88 and ground 82. A resistor 53 is connected between the collector 89 and a source of negative voltage $B_1$. Resistor 55 is connected between the emitter 90 and one side of resistor 59. The other side of resistor 59 is connected to ground 82. The junction of resistors 55 and 59 is connected through resistor 58 to the emitter 93 of transistor 57. The collector 92 of transistor 57 is connected through resistor 56 to the negative voltage terminal $B_1$. The junction of resistor 56 and collector 92 is connected through a resistor 60 to ground 82. The base 91 is connected through resistor 61 to the negative voltage terminal $B_1$ and also through resistor 62 to ground 82.

A first output of converter 1 on lead 83 which is connected to the collector 89 of transistor 54, is coupled through a resistor 63 to the base 94 of transistor 66 of the amplifier 2. The junction of resistor 63 and base 94 is connected through resistor 64 to a negative voltage supply $B_2$. The collector 95 is connected through resistor 65 to the negative voltage terminal $B_1$. The emitter 96 of transistor 66 is connected through resistor 67 to ground 82. A second output of the converter 1 on lead 84 which is connected to the collector 92 of transistor 57, is coupled through resistor 70 to the base 97 of transistor 69 of the amplifier 2. The junction of resistor 70 and base 97 is connected through resistor 71 to the negative voltage terminal $B_2$. The emitter 99 of transistor 69 is connected to the junction of emitter 96 of transistor 66 and resistor 67. The collector 98 of transistor 69 is connected through resistor 68 to the negative voltage terminal $B_1$. An output of amplifier 2 on lead 85 which is connected to collector 98, is coupled through resistor 79 to the base 103 of transistor 77 in the adder unit 3. The junction of resistor 79 and base 103 is connected through resistor 81 to ground 82. The emitter 105 is connected through resistor 78 to ground 82. The output on lead 83 of the converter 1 is coupled through resistor 72 to the base 100 of transistor 75 in the adder 3. The junction of resistor 72 and base 100 is connected through resistor 73 to ground 82. The emitter 102 is connected through resistor 76 to ground 82. The collector 101 of transistor 75 is connected to the collector 104 of transistor 77. The collector 101 is also connected through resistor 74 to the negative voltage terminal $B_1$. The output voltage $V_{out}$ is present across terminal 80 which is connected to the collector 104, and terminal 87 which is connected to ground 82.

In the operation of the circuit of FIG. 4, a voltage $V_{in}$, which may have the linear form of curve 11 of FIG. 2 (*c*), is impressed across terminals 50 and 86 of the converter 1. It is again noted that each of the transistor stages of FIG. 4 is of the inverting type. The converter circuitry produces complementary linear outputs on leads 83 and 84 which are the input voltages to transistors 66 and 69 respectively of the amplifier 2. The voltages on leads 83 and 84 have approximately the shape of the curves 12 and 13 respectively of FIG. 2(*c*). The circuitry of the amplifier 2 operates in the same manner as described for the circuit of FIG. 3(*b*). In the embodiment of FIG. 4 that value of emitter signal resistance solely in series with each emitter of the transistors of amplifier 2 is essentially zero since such resistors are not present in the circuit. This enables the amplifier 2 circuitry to provide the desired large curvature, as shown by curve 14 of FIG. 2(*c*), at its output on lead 85. At the same time the value of the common emitter resistor 67 is made large relative to the emitter signal resistance of the respective transistors 66, 69. For example the resistor 67 may have a value such as 1600 ohms. This large resistor 67 preserves the desired voltage shape on output lead 85 as the ambient temperature varies by negating the changes in base-emitter junction resistance of the amplifier transistors. In order to provide a voltage $V_{out}$ with the proper direction of curvature and orientational tilt for the oscillator control voltage, the output of amplifier 2 on lead 85 is fed to the adder circuitry 3. There it is summed with the linear voltage on lead 83 of the converter 1, yielding an output voltage $V_{out}$ which has the shape of curve 15 of FIG. 2(*c*). The shape of voltage $V_{out}$ from the adder 3 has the proper orientation and curvature for exactly compensating the nonlinear frequency versus control voltage response of a voltage controlled oscillator such as the oscillator 4 of FIG. 1. The result is an output signal whose frequency is linear with command input voltage to the shaper circuit, over a range of operating ambient temperature.

I claim:

1. In combination:

a first circuit for providing at least on e pair of complementary linear output signals in response to a linear input signal;

a second circuit responsive to the output signals of said first circuit, said second circuit including a first impedance means for providing a desired shape of nonlinear continuous first derivative output signal from said second circuit, said second circuit also including impedance means for maintaining the shape of said nonlinear output signal over a significant ambient temperature range of said circuit; and a third circuit responsive to said nonlinear output signal and one of said pair of complementary linear output signals of said first circuit, for providing a desired orientation of said nonlinear-shaped signal.

2. The combination of claim 1, wherein; said second circuit is a transistorized differential-type amplifier, having separate low impedance paths between the respective emitters of said transistors and a common reference point, and a high impedance path between said common reference point and a point of reference potential.

3. The combination of claim 2, wherein; the impedance of said low impedance path is substantially smaller than the base-emitter junction impedance of said transistors, and the impedance of said high impedance path is substantially larger than the base-emitter junction impedance of said transistors.

4. In combination with an oscillator whose output frequency is variable in a linear manner in response to a control signal, said control signal having a desired predetermined nonlinear continuous first derivative characteristic, means for providing and maintaining substantially invariant said predetermined characteristic of said control signal over a significant range of ambient temperature, comprising; a first circuit for providing a pair of complementary linear output signals in response to a linear input command signal, a second circuit including a transistorized differential-type amplifier having separate low impedance paths between the respective emitters of said transistors and a common reference point, and a high impedance path between said common reference point and a point of reference potential, the impedance of said low impedance path being substantially less than the base-emitter junction impedance of said transistors, and the impedance of said high impedance path being substantially greater than the base emitter impedance of said transistors, said amplifier being responsive to said complementary linear outputs of said first circuit to provide over a significant ambient temperature range by operation of said impedance paths a further output having a given nonlinear continuous first derivative characteristic, and a third circuit responsive to said further output and one of said outputs of said first circuit for combining said outputs to provide said control signal which varies with the linear command input to said first circuit in said desired predetermined nonlinear manner.

UNITED STATES PATENT OFFICE

CERTIFICATE OF CORRECTION

Patent No. 3,569,867 Dated 3/9/71

Inventor(s) Robert L. Ernst

It is certified that error appears in the above-identified patent and that said Letters Patent are hereby corrected as shown below:

Column 2, line 32 delete "This is approximately the proper curvature shown as curve 14 of Fig. 2(c)."

Column 2, line 54 delete "The shaper circuit 9 of the present invention oscillator."

Column 2, line 70 after "is" insert --essentially driven by a voltage source. The base current is--

Column 2, line 72 after the word "zero" delete "of" and insert --or--

Column 5, line 28 after the word "including" insert --a second--

Signed and sealed this 14th day of September 1971.

(SEAL)
Attest:

EDWARD M.FLETCHER,JR.
Attesting Officer

ROBERT GOTTSCHALK
Acting Commissioner of Paten

FORM PO-1050 (10-69)

USCOMM-DC 60376-P